(12) United States Patent
Matsumoto

(10) Patent No.: US 6,969,892 B2
(45) Date of Patent: Nov. 29, 2005

(54) INPUT PROTECTION CIRCUIT PREVENTING ELECTROSTATIC DISCHARGE DAMAGE OF SEMICONDUCTOR INTEGRATED CIRCUIT

(75) Inventor: Shuuji Matsumoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/702,488

(22) Filed: Nov. 7, 2003

(65) Prior Publication Data

US 2004/0207079 A1      Oct. 21, 2004

(30) Foreign Application Priority Data

Apr. 17, 2003   (JP) ............................ P2003-113179

(51) Int. Cl.[7] ............................................. H01L 23/62
(52) U.S. Cl. ..................... 257/355; 257/356; 257/529
(58) Field of Search ............................. 257/355–356, 257/358–365, 209, 529–530

(56) References Cited

U.S. PATENT DOCUMENTS 5,656,967 A * 8/1997 Casper et al. ............... 327/525
5,895,942 A * 4/1999 Deguchi ...................... 257/209
5,998,853 A * 12/1999 Sugasawara ................. 257/529
6,693,783 B2 * 2/2004 Szabo et al. ................ 361/104

FOREIGN PATENT DOCUMENTS

JP            5-36947       2/1993
JP         2001-244338     9/2001

* cited by examiner

Primary Examiner—Phat X. Cao
Assistant Examiner—Theresa T. Doan
(74) Attorney, Agent, or Firm—Oblon, Spivak, McClelland, Maier & Neustadt, P.C.

(57) ABSTRACT

An input protection circuit comprises a semiconductor chip, an internal circuit disposed on the semiconductor chip, a first input/output terminal which is disposed on the semiconductor chip and connected to the internal circuit, a second input/output terminal which is disposed on the semiconductor chip, connected to the internal circuit and disposed at a position adjacent to the first input/output terminal, and a fusing part which is disposed on the semiconductor chip and connected between the first and second input/output terminals.

2 Claims, 7 Drawing Sheets

INPUT PROTECTION CIRCUIT PREVENTING ELECTROSTATIC DISCHARGE DAMAGE OF SEMICONDUCTOR INTEGRATED CIRCUIT

CROSS REFERENCE TO RELATED APPLICATIONS

This application is based upon and claims the benefit of priority from the prior Japanese Patent Applications No. P2003-113179, filed on Apr. 17, 2003; the entire contents of which are incorporated herein by reference.

BACKGROUND OF THE INVENTION

1. Field of the Invention

The present invention relates to an input protection circuit, more particularly to an input protection circuit preventing electrostatic discharge damage of a semiconductor integrated circuit.

2. Description of the Related Art

A semiconductor integrated circuit has gate input circuits, such as field effect transistors, as input/output terminals. The gate input circuits connected to the input/output terminals are sometimes destroyed by electrostatic discharge (ESD) from the human body or various devices. Particularly, due to the ESD applied between the input/output terminals before mounting semiconductor integrated circuits on a circuit board or the like, gates of a field effect transistor used for an input circuit are sometimes destroyed.

As a measure to solve the above problem, disclosed is an input protection circuit in which voltage levels of input/output terminals do not exceed a supply voltage because of diodes (hereinafter referred to as "the first conventional technology"). The input protection circuit according to the first conventional technology includes a diode having its cathode terminal connected to a power source and its anode terminal connected to an input/output terminal and a diode having its cathode terminal connected to the ground and its anode terminal connected to the input/output terminal. According to the first conventional technology, when the ESD is applied to the input/output terminal, a current path to the power source or the ground is created by diode forward conduction or reverse breakdown. Thus, application of a high voltage to internal elements of a semiconductor integrated circuit can be prevented.

Moreover, disclosed is an input protection circuit in which fuses are provided between input/output terminals and diodes (hereinafter referred to as "the second conventional technology"). In the input protection circuit according to the second conventional technology, when a direct current is applied to a fuse after a semiconductor integrated circuit is mounted, the fuse is blown out. When the fuse is blown out, the input protection circuit is separated from the input/output terminals. Thus, the input protection circuit is not affected by a parasitic capacitance that the diodes have. When there is no influence of the parasitic capacitance of the diodes, a high-speed transmission of an input signal is not impaired.

However, a junction area of the diodes of the input protection circuit according to the first conventional technology is designed to be about several square micrometers in order to instantly apply a large amount of charges associated with high-voltage electrostatic discharge. In this case, a junction capacitance of the diodes sometimes reaches several pF. There was a problem that attenuation of a signal level and a propagation delay of a signal occur due to a parasitic capacitance of the diodes and the like.

Moreover, the input protection circuit according to the second conventional technology has the diode in a cell. Thus, there was a problem that the diode in the cell causes an increase in an area of a semiconductor integrated circuit.

SUMMARY OF THE INVENTION

In a first aspect of the present invention, an input protection circuit comprises a semiconductor chip, an internal circuit disposed on the semiconductor chip, a first input/output terminal which is disposed on the semiconductor chip and connected to the internal circuit, a second input/output terminal which is disposed on the semiconductor chip, connected to the internal circuit and disposed at a position adjacent to the first input/output terminal, and a fusing part which is disposed on the semiconductor chip and connected between the first and second input/output terminals.

In a second aspect of the present invention, an input protection circuit comprises a semiconductor chip, an internal circuit disposed on the semiconductor chip, a plurality of input/output terminals which are disposed on the semiconductor chip and connected to the internal circuit, and a plurality of fusing parts which are disposed on the semiconductor chip and disposed between input/output terminals adjacent to each other among the plurality of input/output terminals.

In a third aspect of the present invention, an input protection circuit comprises, a semiconductor chip, an internal circuit disposed on the semiconductor chip, a plurality of terminal groups which are disposed on the semiconductor chip, are connected to the internal circuit and have a plurality of input/output terminals, an electrical wiring which is disposed on the semiconductor chip and connects the plurality of terminal groups to each other, and a plurality of fusing parts which are disposed on the semiconductor chip and respectively disposed between input/output terminals adjacent to each other among the plurality of input/output terminals.

DETAILED DESCRIPTION OF THE INVENTION

Figure 1:
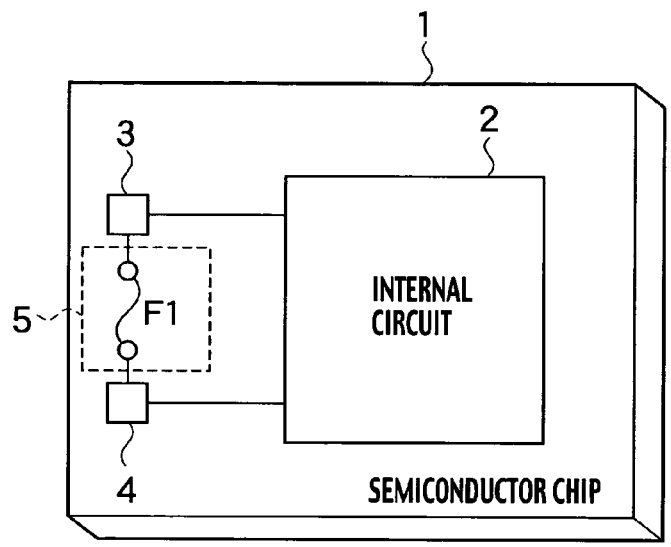
FIG. 1 is a view explaining an input protection circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

(First Embodiment)

Figure 2:
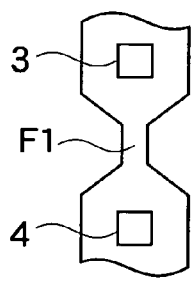
FIG. 2 is a view explaining a fusing part of the input protection circuit according to the first embodiment of the present invention.

As shown in FIG. 1, an input protection circuit according to a first embodiment of the present invention includes: a semiconductor chip 1; an internal circuit 2 disposed on the semiconductor chip 1; a first input/output terminal 3 which is disposed on the semiconductor chip 1 and connected to the internal circuit 2; a second input/output terminal 4 disposed at a position adjacent to the first input/output terminal 3 on the semiconductor chip 1; and a fusing part 5 connected between the first and second input/output terminals 3 and 4 on the semiconductor chip 1. The fusing part 5 includes a fuse F1 connected between the first and second input/output terminals 3 and 4. The fuse F1 is blown out when a fusion setting current is applied between the first and second input/output terminals 3 and 4. For the fuse F1, as shown in FIG. 2, used is a part of a rectangular piece of a metal wiring disposed on the semiconductor chip 1, the part having the smallest cross-sectional area. As the metal wiring, it is considered to use, for example, an aluminum film, a polysilicon film and the like.

Figure 3A:
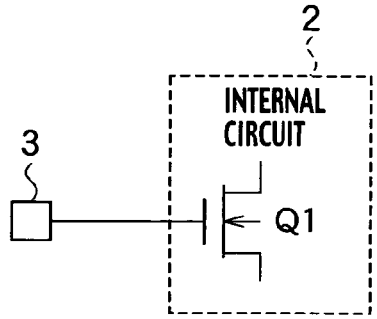
FIGS. 3A and 3B are views explaining internal circuits of the input protection circuit according to the first embodiment of the present invention.
Figure 3B:
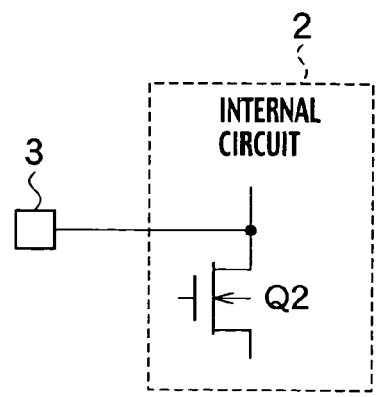

As shown in FIG. 3A, the first input/output terminal 3 is connected, for example, to a gate terminal of a field effect transistor Q1 in the internal circuit 2. Alternatively, as shown in FIG. 3B, the first input/output terminal 3 is connected, for example, to a source terminal (or a drain terminal) of a field effect transistor Q2 in the internal circuit 2. Similarly to the first input/output terminal 3 shown in FIGS. 3A and 3B, the second input/output terminal 4 is connected to any of gate, source, and drain terminals of a field effect transistor in the internal circuit 2.

With reference to FIG. 1, description will be given concerning an operation before blowout of the fusing part 5 in the input protection circuit according to the first embodiment. Here, the description is with regard to gate oxide film breakdown inside a semiconductor integrated circuit due to application of electrostatic discharge (ESD) during steps of fabricating the semiconductor integrated circuit. The gate oxide film breakdown inside the semiconductor integrated circuit due to the ESD occurs most frequently in the steps of assembling, selecting, packing and board mounting. On the contrary, after mounting the semiconductor integrated circuit on a circuit board, input/output terminals become less likely to be affected by static electricity directly from the outside. In other words, the semiconductor integrated circuit needs to be protected before being mounted on the circuit board.

When the ESD is applied between the first and second input/output terminals 3 and 4 before blowout of the fusing part 5, the ESD is applied to the fuse F1. In other words, the ESD is outputted from the first input/output terminal 3 to the second input/output terminal 4 via the fuse F1. Thus, the gate oxide film breakdown inside the semiconductor integrated circuit connected to the input/output terminals does not occur. Note that a current generated by the ESD is weak and thus the fuse F1 is not blown out.

After mounting the semiconductor integrated circuit on the circuit board, a fusion setting current is applied between the first and second input/output terminals 3 and 4 of the semiconductor integrated circuit, the fuse F1 is blown out and the first and second input/output terminals are electrically separated from each other. Fusing conditions for the fuse F1 are determined based on the material and cross-sectional area of the metal wiring.

According to the input protection circuit of the first embodiment, the gate oxide film breakdown due to the ESD can be suppressed in the steps before the mounting. Moreover, after the mounting, the fuse F1 is blown out and an element having a capacitance component is not connected to the first and second input/output terminals 3 and 4. Thus, miniaturization becomes possible without causing attenuation of a signal level of an input/output signal from the first and second input/output terminals 3 and 4 or a propagation delay of the input/output signal.

(Second Embodiment)

Figure 4:
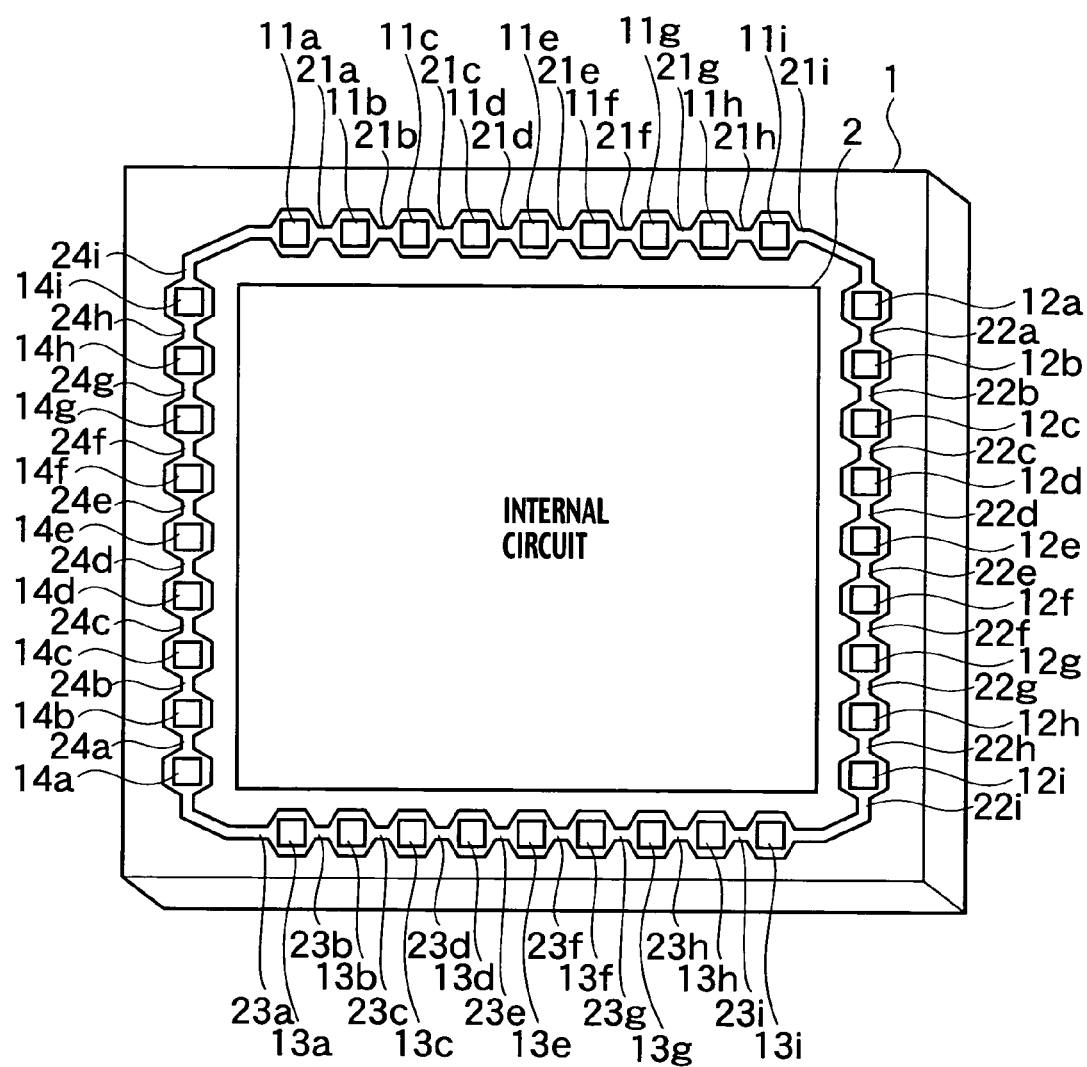
FIG. 4 is a view explaining an input protection circuit according to a second embodiment of the present invention.

As shown in FIG. 4, an input protection circuit according to a second embodiment of the present invention includes a plurality of input/output terminals 11a to 11i, 12a to 12i, 13a to 13i and 14a to 14i on a semiconductor chip 1. It was described that, in the input protection circuit shown in FIG. 1, the fusing part is provided between the two terminals, which are the first and second input/output terminals 3 and 4. However, in the input protection circuit shown in FIG. 4, the plurality of input/output terminals 11a to 11i, 12a to 12i, 13a to 13i and 14a to 14i, which are adjacent to each other, are respectively connected to each other by a plurality of fusing parts 21a to 21i, 22a to 22i, 23a to 23i and 24a to 24i. For example, the input/output terminal 11a is connected to the input/output terminal 11b by the fusing part 21a. Note that the plurality of input/output terminals 11a to 11i, 12a to 12i, 13a to 13i and 14a to 14i are connected to an internal circuit 2, respectively. For example, fuses are used as the plurality of fusing parts 21a to 21i, 22a to 22i, 23a to 23i and 24a to 24i. The rest of the structure is virtually the same as that of the first embodiment and thus repetitive description will be omitted.

Figure 5:
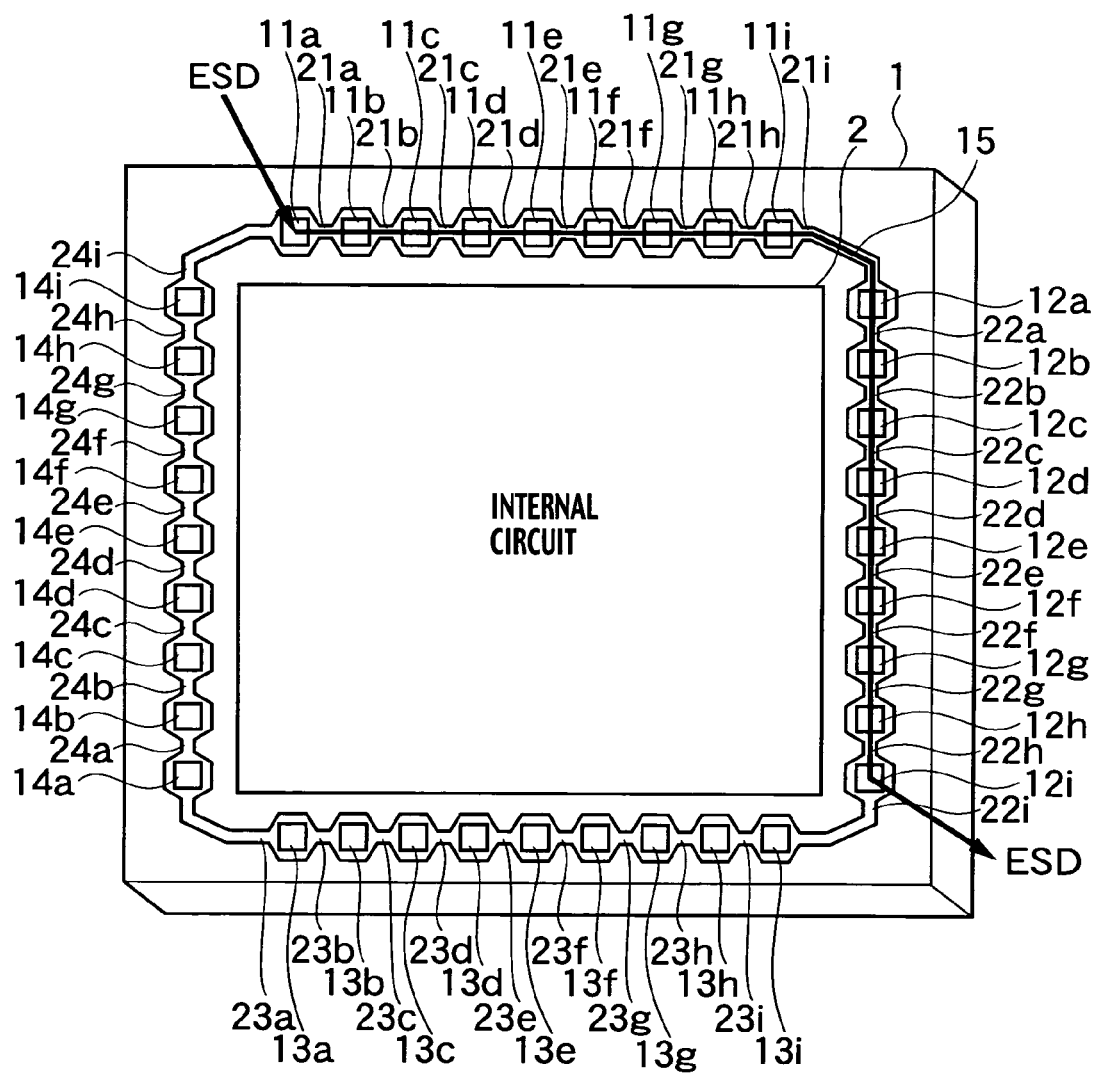
FIG. 5 is a view explaining a current path when ESD is applied to the input protection circuit according to the second embodiment of the present invention.

With reference to FIG. 5, description will be given concerning an operation of the input protection circuit according to the second embodiment. It is assumed that, before blowout of the fusing parts 21a to 21i, 22a to 22i, 23a to 23i and 24a to 24i, ESD is applied between the input/output terminals 11a and 12i. The ESD inputted from the input/output terminal 11a is outputted from the input/output terminal 12i through a current path 15. The ESD is applied to the fusing parts 21a to 21i and 22a to 22i. In other words, the ESD is outputted from the input/output terminal 11a to the input/output terminal 12i via the fusing parts 21a to 21i and 22a to 22i. Thus, the gate oxide film breakdown inside the semiconductor integrated circuit connected to the input/output terminals does not occur. Note that a current generated by the ESD is weak and thus the fusing parts 21a to 21i and 22a to 22i are not blown out.

After mounting the semiconductor integrated circuit on a circuit board, a fusion setting current is applied between the input/output terminals adjacent to each other. These terminals are among the plurality of input/output terminals 11a to 11$i$, 12$a$ to 12$i$, 13$a$ to 13$i$ and 14$a$ to 14$i$ disposed on the semiconductor chip 1 so as to be adjacent to each other. Then the fusing parts 21$a$ to 21$i$, 22$a$ to 22$i$, 23$a$ to 23$i$ and 24$a$ to 24$i$ are blown out to electrically separate each of the plurality of input/output terminals 11$a$ to 11$i$, 12$a$ to 12$i$, 13$a$ to 13$i$ and 14$a$ to 14$i$ from each other. Fusing conditions for the fusing parts 21$a$ to 21$i$, 22$a$ to 22$i$, 23$a$ to 23$i$ and 24$a$ to 24$i$ are determined based on a material and cross-sectional area of a metal wiring used as the fuses.

According to the input protection circuit of the second embodiment, the gate oxide film breakdown due to the ESD can be suppressed in the steps before the mounting. Moreover, after the mounting, the fusing parts are blown out and an element having a capacitance component is not connected to the plurality of input/output terminals 11$a$ to 11$i$, 12$a$ to 12$i$, 13$a$ to 13$i$ and 14$a$ to 14$i$. Thus, miniaturization becomes possible without causing attenuation of a signal level of an input/output signal from the input/output terminals 11$a$ to 11$i$, 12$a$ to 12$i$, 13$a$ to 13$i$ and 14$a$ to 14$i$, or a propagation delay of the input/output signal.

(Third Embodiment)

Figure 6:
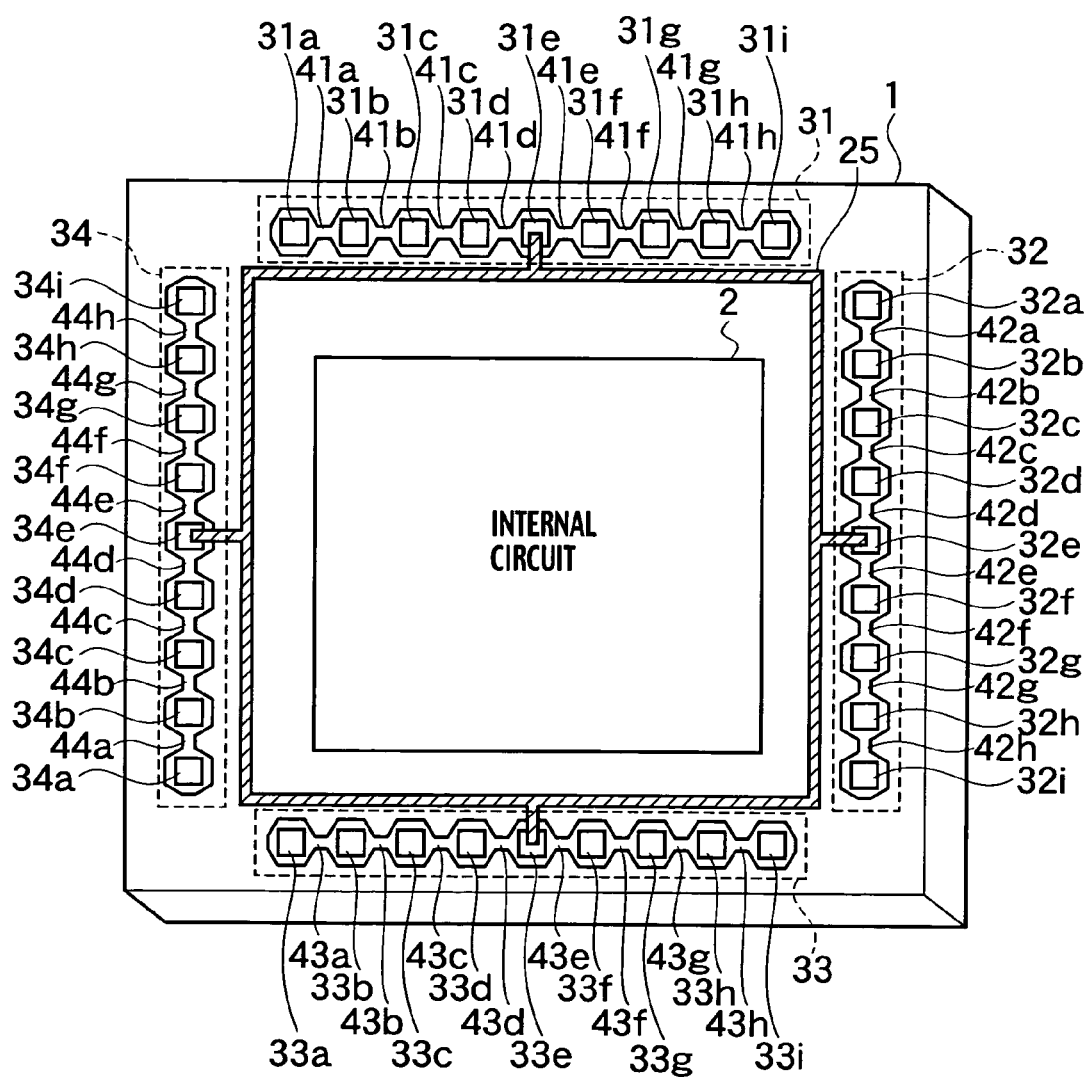
FIG. 6 is a view explaining an input protection circuit according to a third embodiment of the present invention.

As shown in FIG. 6, an input protection circuit according to a third embodiment of the present invention includes: a semiconductor chip 1; an internal circuit 2 disposed on the semiconductor chip 1; a plurality of terminal groups 31 to 34 disposed on the semiconductor chip 1 and connected to the internal circuit 2; and an electrical wiring 25 which is disposed on the semiconductor chip 1 and connects the plurality of terminal groups 31 to 34 to each other. The first terminal group 31 includes: a plurality of input/output terminals 31$a$ to 31$i$; and fusing parts 41$a$ to 41$h$ respectively disposed between the input/output terminals adjacent to each other, which are among the plurality of input/output terminals 31$a$ to 31$i$. The second terminal group 32 includes: a plurality of input/output terminals 32$a$ to 32$i$; and fusing parts 42$a$ to 42$h$ respectively disposed between the input/output terminals adjacent to each other, which are among the plurality of input/output terminals 32$a$ to 32$i$. The third terminal group 33 includes: a plurality of input/output terminals 33$a$ to 33$i$; and fusing parts 43$a$ to 43$h$ respectively disposed between the input/output terminals adjacent to each other, which are among the plurality of input/output terminals 33$a$ to 33$i$. The fourth terminal group 34 includes: a plurality of input/output terminals 34$a$ to 34$i$; and fusing parts 44$a$ to 44$h$ respectively disposed between the input/output terminals adjacent to each other, which area among the plurality of input/output terminals 34$a$ to 34$i$. Here, the input/output terminal 31$e$ is connected to the input/output terminals 32$e$, 33$e$ and 34$e$ by the loop-shaped electrical wiring 25 on the semiconductor chip 1.

Figure 7:
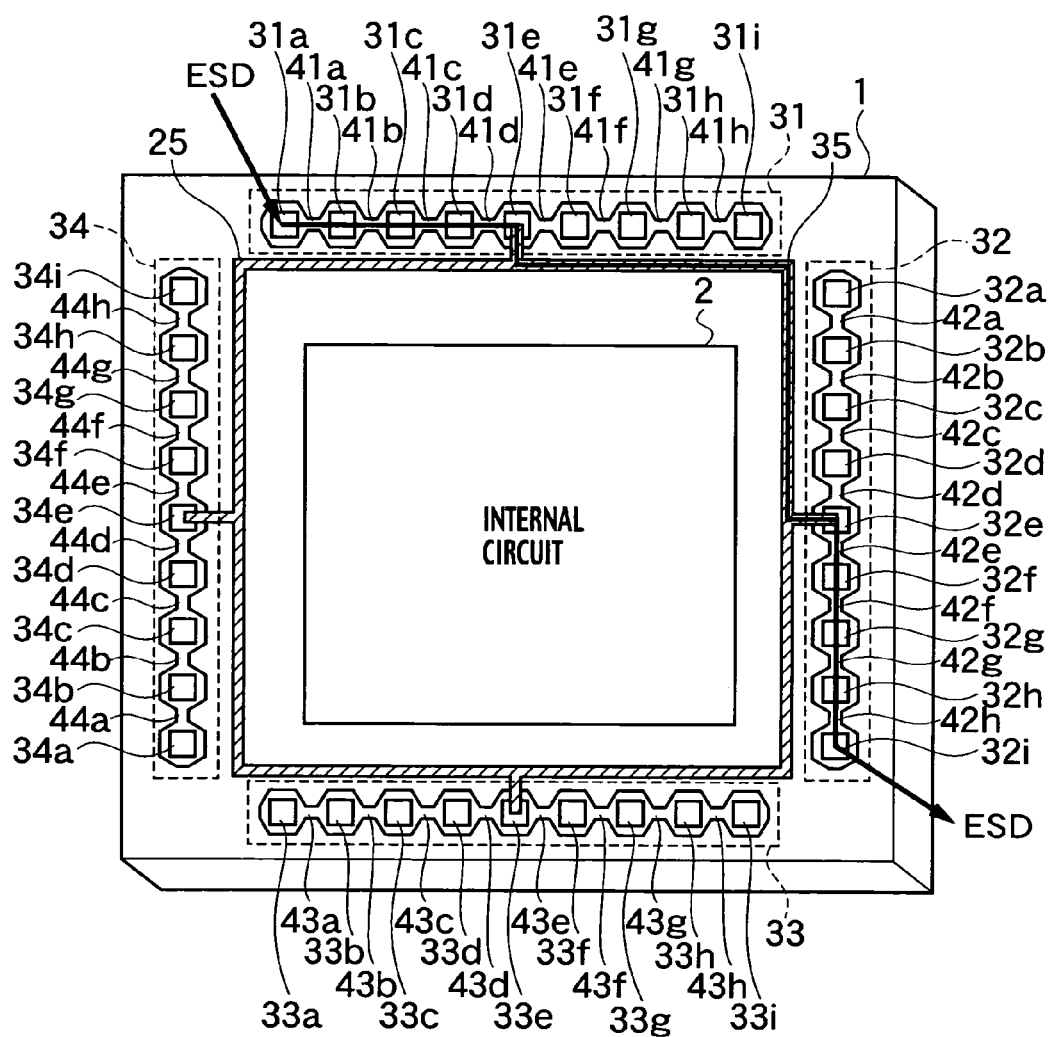
FIG. 7 is a view explaining a current path when ESD is applied to the input protection circuit according to the third embodiment of the present invention.

With reference to FIG. 7, an operation of the input protection circuit according to the third embodiment will be described. It is assumed that, before blowout of the fusing parts 41$a$ to 41$h$, 42$a$ to 42$h$, 43$a$ to 43$h$ and 44$a$ to 44$h$, ESD is applied between the input/output terminals 31$a$ and 32$i$. Specifically, the ESD inputted from the input/output terminal 31$a$ is outputted from the input/output terminal 32$i$ through a current path 35. Thus, the gate oxide film breakdown inside the semiconductor integrated circuit connected to the input/output terminals does not occur. Note that a current generated by the ESD is weak and thus the fusing parts 41$a$ to 41$d$ and 42$e$ to 42$h$ are not blown out.

After mounting the semiconductor integrated circuit on a circuit board, a fusion setting current is applied between the input/output terminals adjacent to each other. These terminals are among the plurality of input/output terminals 31$a$ to 31$i$, 32$a$ to 32$i$, 33$a$ to 33$i$ and 34$a$ to 34$i$ disposed on the semiconductor chip 1 so as to be adjacent to each other. Then, the fusing parts 41$a$ to 41$h$, 42$a$ to 42$h$, 43$a$ to 43$h$ and 44$a$ to 44$h$ are blown out to electrically separate each of the plurality of input/output terminals 31$a$ to 31$i$, 32$a$ to 32$i$, 33$a$ to 33$i$ and 34$a$ to 34$i$ from each other. Fusing conditions for the fusing parts 41$a$ to 41$h$, 42$a$ to 42$h$, 43$a$ to 43$h$ and 44$a$ to 44$h$ are determined based on a material and cross-sectional area of a metal wiring used as the fuses.

Figure 8:
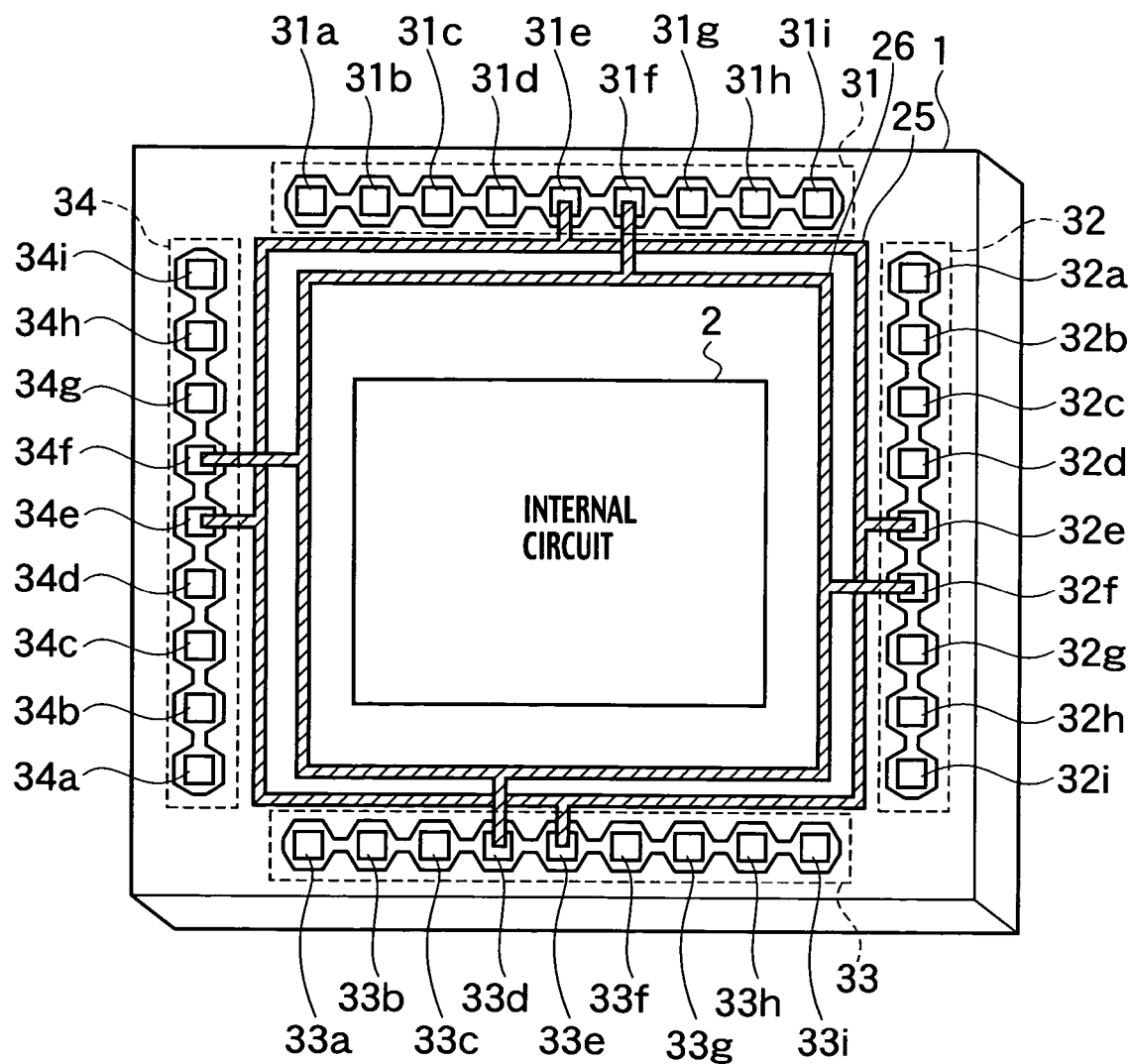
FIG. 8 is a view explaining the input protection circuit according to the third embodiment of the present invention.

The electrical wiring 25 of the input protection circuit shown in FIG. 6 is represented by a loop-shaped wiring disposed on the semiconductor chip 1. However, the electrical wiring 25 does not need to have a loop shape as long as the plurality of terminal groups 31 to 34 are connected to each other. Moreover, as shown in FIG. 8, besides the electrical wiring 25, the input protection circuit may further include an electrical wiring 26 which connects the plurality of terminal groups 31 to 34 to each other. By providing a plural number of electrical wirings, safety upon application of the ESD is enhanced.

According to the input protection circuit of the third embodiment, the gate oxide film breakdown due to the ESD can be suppressed in the steps before the mounting. Moreover, after the mounting, the fusing parts are blown out and an element having a capacitance component is not connected to the plurality of input/output terminals 31$a$ to 31$i$, 32$a$ to 32$i$, 33$a$ to 33$i$ and 34$a$ to 34$i$. Thus, miniaturization becomes possible without causing attenuation of a signal level of an input/output signal from the input/output terminals 31$a$ to 31$i$, 32$a$ to 32$i$, 33$a$ to 33$i$ and 34$a$ to 34$i$ or a propagation delay of the input/output signal.

(Fourth Embodiments)

Figure 9:
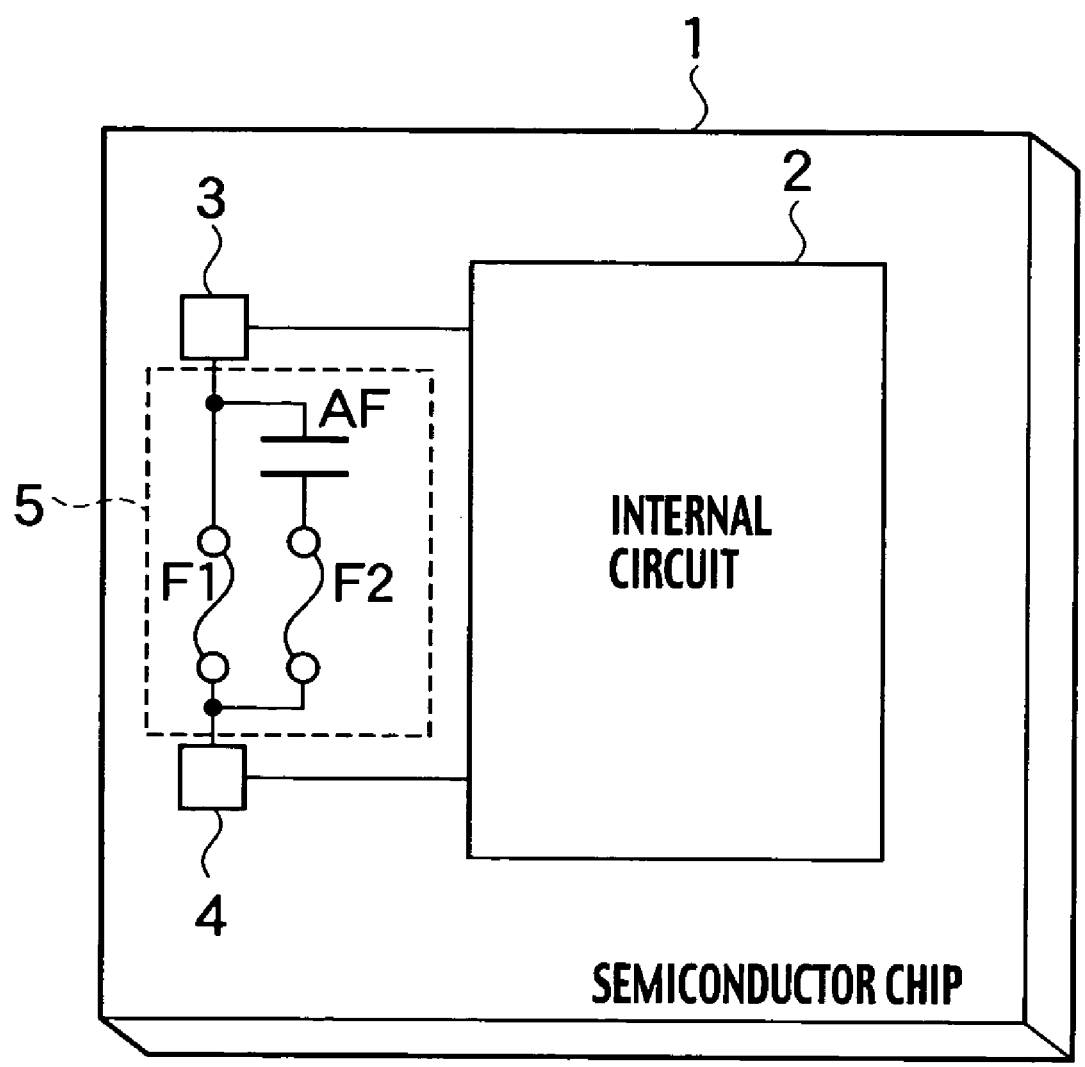
FIG. 9 is a view explaining an input protection circuit according to a fourth embodiment of the present invention.

As shown in FIG. 9, an input protection circuit according to a fourth embodiment of the present invention further includes a series circuit including an antifuse AF and a fuse F2 for a second blowout in parallel with the fuse F1 used for the fusing part 5 of the input protection circuit shown in FIG. 1. The input protection circuits described in the first to third embodiments have a structure in which no voltage is applied to the internal circuit 2. Thus, before the blowout of the fusing part 5 of the input protection circuit, no voltage or signal can be applied to the internal circuit 2. Since characteristic evaluation cannot be performed in a chip state, the input protection circuits described in the first to third embodiments evaluate the operation of the internal circuit 2 by wafer die sort before the fuse F1 is formed. On the contrary, the input protection circuit according to the fourth embodiment can perform the characteristic evaluation in the chip state before shipping.

With reference to FIG. 9, description will be given concerning an operation before blowout of the fusing part 5 of the input protection circuit according to the fourth embodiment of the present invention. The internal circuit 2 in a state of a chip formed on a wafer is protected by the fuse F1.

Before the blowout of the fusing part 5, ESD is applied between the first and second input/output terminals 3 and 4. Specifically, the ESD is applied to the fuse F1 via the first input/output terminal 3. Thus, the gate oxide film breakdown inside the semiconductor integrated circuit connected to the input/output terminals does not occur. Note that a current generated by the ESD is weak and thus the fuse F1 is not blown out.

In order to confirm the operation of the internal circuit 2, after mounting the semiconductor integrated circuit on a test board, the fuse F1 is blown out by applying a fusion setting current between the first and second input/output terminals 3 and 4 of the semiconductor integrated circuit. Then the first and second input/output terminals 3 and 4 are electrically separated from each other to release a protection state temporarily. The fusing conditions for the fuse F1 are determined based on the material and cross-sectional area of the metal wiring. The internal circuit 2 mounted on the semiconductor integrated circuit is evaluated whether or not the operations thereof conform to a specification that should be checked before shipment of a product. After the evaluation is finished, the antifuse AF becomes electrically conductive when a conducting setting voltage is applied thereto. When the antifuse AF becomes conductive, the first and second input/output terminals 3 and 4 are connected to each other by the fuse F2, thus returning to the protection state. After the antifuse becomes conductive, the chip-state semiconductor integrated circuit is detached from an evaluation board.

The semiconductor integrated circuit detached from the evaluation board is mounted on a circuit board after shipment. The fuse F2 for a second blowout of the semiconductor integrated circuit mounted on the circuit board is blown out when the fusion setting current is applied between the first and second input/output terminals 3 and 4.

According to the input protection circuit of the fourth embodiment, the gate oxide film breakdown due to the ESD can be suppressed in the steps before the mounting. Moreover, after the mounting, the fusing part is blown out and an element having a capacitance component is not connected to the first and second input/output terminals 3 and 4. Thus, miniaturization becomes possible without causing attenuation of a signal level of an input/output signal from the first and second input/output terminals 3 and 4 or a propagation delay of the input/output signal. Furthermore, a voltage is applied to the antifuse AF and the input/output terminals are connected to each other again and protected by the fuse F2. Thus, even after the operation evaluation of the internal circuit 2, the internal circuit 2 can be protected again.

(Other Embodiment)

Although the present invention is described according to the first to fourth embodiments as described thus far, it should be understood that those descriptions and drawings constituting a part of the present disclosure do not limit the present invention. From the present disclosure, various alternative embodiments, embodiments and operational technologies will become apparent to those skilled in the art.

According to the descriptions of the foregoing second and third embodiments, the fuse connect each of the input/output terminals. However, it is possible to use the fusing part 5 including the antifuse AF as described in the fourth embodiment.

Various modifications will become possible for those skilled in the art after receiving the teachings of the present disclosure without departing from the scope thereof.

What is claimed is:

1. An intermediate product for a semiconductor integrated circuit having an input protection circuit, before being mounted on a circuit board, the input protection circuit comprising:
   a semiconductor chip;
   an internal circuit disposed on the semiconductor chip;
   a first input/output terminal disposed on the semiconductor chip and connected to the internal circuit;
   a second input/output terminal disposed on the semiconductor chip, connected to the internal circuit and disposed at a position adjacent to the first input/output terminal; and
   a fusing part disposed on the semiconductor chip and directly connected between the first and second input/output terminals so as to form a shortest path between the first and second input/output terminals,
   wherein the fusing part is configured to be blown out so that the first and second input/output terminals are electrically separated from each other after the intermediate product is mounted on the circuit board.

2. The intermediate product according to claim 1, wherein the fusing part includes a first fuse connected between the first and second input/output terminals.

* * * * *